(12) United States Patent
Huang et al.

(10) Patent No.: US 7,554,197 B2
(45) Date of Patent: Jun. 30, 2009

(54) HIGH FREQUENCY IC PACKAGE AND METHOD FOR FABRICATING THE SAME

(75) Inventors: Hsiang-Ming Huang, Tainan (TW); An-Hong Liu, Tainan (TW); Yeong-Jyh Lin, Tainan (TW); Yi-Chang Lee, Tainan (TW); Wu-Chang Tu, Tainan (TW); Chun-Hung Lin, Tainan (TW); Shih Feng Chiu, Tainan (TW)

(73) Assignees: ChipMOS Technologies (Bermuda) Ltd, Hamilton (BM); ChipMOS Technologies Inc., Hsinchu (TW)

( * ) Notice: Subject to any disclaimer, the term of this patent is extended or adjusted under 35 U.S.C. 154(b) by 295 days.

(21) Appl. No.: 11/400,182

(22) Filed: Apr. 10, 2006

(65) Prior Publication Data

US 2007/0235871 A1    Oct. 11, 2007

(51) Int. Cl.
*H01L 23/48* (2006.01)
*H01L 23/28* (2006.01)
*H01L 23/29* (2006.01)

(52) U.S. Cl. .......... 257/737; 257/673; 257/773; 257/776; 257/783; 257/787; 257/789; 257/795; 257/E23.021; 257/E23.069; 257/E23.121

(58) Field of Classification Search .......... 257/737, 257/735, 666–667, 678–733, 778–795, E23.021, 257/E23.069
See application file for complete search history.

(56) References Cited

U.S. PATENT DOCUMENTS 6,975,035 B2 * 12/2005 Lee .......................... 257/778

* cited by examiner

*Primary Examiner*—Jasmine J Clark
(74) *Attorney, Agent, or Firm*—Troxell Law Office PLLC

(57) ABSTRACT

A high frequency IC package mainly includes a substrate, a bumped chip, and a plurality of conductive fillers where the substrate has a plurality of bump holes penetrating from the top surface to the bottom surface. The active surface of the chip is attached to the top surface of the substrate in a manner that the bumps are inserted into the bump holes respectively. The conductive fillers are formed in the bump holes to electrically connect the bumps to the circuit layer of the substrate. The high frequency IC package has a shorter electrical path and a thinner package thickness.

12 Claims, 6 Drawing Sheets

HIGH FREQUENCY IC PACKAGE AND METHOD FOR FABRICATING THE SAME

FIELD OF THE INVENTION

The present invention relates to an IC package, and more particularly, to a high frequency IC package and its fabricating processes.

BACKGROUND OF THE INVENTION

In conventional IC package, either wire bonding or flip chip mounting are commonly used as the electrical connections between the chip and the substrate for different applications and functions of the IC chip.

As shown in FIG. 1, a conventional wire-bonding type IC package 100 includes a rigid PCB substrate 110, a chip 120, and a plurality of bonding wires 130 where the substrate 110 has a top surface 111 and a bottom surface 112. A slot 114 penetrates through the substrate 110 from the top surface 111 to the bottom surface 112. As shown in FIG. 2, a plurality of connecting pads 113 are disposed along the both sides of the slot 114 on the bottom surface 112 of the substrate 110. The chip 120 has a plurality of bonding pads 122 formed on the active surface 121. When the active surface 121 of the chip 120 is attached to the top surface 111 of the substrate 110, the plurality of bonding pads 122 are exposed from the slot 114. A plurality of bonding wires 130 are formed by wire-bonding through the slot 114 to electrically connect the bonding pads 122 of the chip 120 with the connecting pads 113 of the substrate 110. The chip 120 and the bonding wires 130 then are encapsulated by an encapsulant 140. The substrate 110 further includes a plurality of ball pads 115 formed on the bottom surface 112 for placing a plurality of solder balls 150 for SMT. However, the wire-bonding type IC package 100 can not meet the high speed requirements of high frequency electronic devices due to poor RLC characteristics of longer bonding wires 130.

As shown in FIG. 3, another conventional IC package 200 utilizing flip-chip mounting technology, includes a BT substrate 210, a bumped chip 220, and an underfill material 230 where the substrate 210 has multiple trace layers and PTHs (plated through hols) for double side electrical connections. As shown in FIG. 4, the substrate 210 has a plurality of PTHs 214 for electrical connections between the connection pads 213 on the top surface 211 and the ball pads 216 on the bottom surface 212 where a flip-chip area 215 is defined on the top surface 211 corresponding to the dimension of the bumped chip 220. The bumped chip 220 has an active surface 211 and a plurality of bumps 223 thereon where the bumps 223 are disposed on a plurality of redistributed UBM pads 222 in an array on the active surface 221. The redistributed UBM pads 222 are connected to original bonding pads of the chip 220 by redistribution trace layer (RDL), not shown in the figures. The bumped chip 220 is electrically connected to the substrate 210 by connecting the bumps 223 of the bumped chip 220 to the connecting pads 213 of the substrate 210. Then the underfill material 230 is formed in the gap between the chip 220 and the substrate 210 to encapsulate the bumps 223. A plurality of solder balls 240 are placed on a plurality of ball pads 216 on the bottom surface 212 of the substrate 210 for electrical connection to a printed circuit board. Even though the IC package 200 can meet the requirements of high frequency electronic devices, however, the multi-layer trace and PTH structure of the BT substrate 210 and RDL design of the bumped chip 220 are required where extra costs are added to manufacture of the IC package 200. Therefore, IC package 200 is not suitable for high frequency memory devices.

SUMMARY OF THE INVENTION

The main purpose of the present invention is to provide a high frequency IC chip package where a substrate has a plurality of bump holes penetrating from top surface to bottom surface. During die-attaching, a plurality of bumps of the chip are inserted into the bump holes respectively. A plurality of conductive fillers are formed in the bump holes for electrical connections between the bumps and the substrate where the electrical path between the chip and the substrate is greatly shortened without extra cost in the substrates nor the chip.

The second purpose of the present invention is to provide a high frequency IC chip package where the substrate is a single-layer flexible printed circuit (FPC) without plated through hole (PTH). The conductive fillers formed in the bump holes are solder paste or conductive ink. Since the substrate is a single-layer printed circuit board, therefore, the cost of the IC package can be greatly reduced. Moreover, the bumps of the chip is hidden in the thin substrate, therefore, the overall thickness of the IC package can be greatly reduced as well.

The third purpose of the present invention is to provide a high frequency IC chip package where a plurality of bumps of a chip are inserted into a plurality of bump holes of a substrate during die-attaching processes. The die-attaching material between the chip and the substrate is patterned to form a plurality of encapsulant flowing channels between the chip and the substrate to enhance encapsulant filling in the encapsulant flowing channels and to provide the outgassing of the bumps or conductive filler during reflow or curing.

According to the present invention, a high frequency IC chip package comprises a substrate, a chip, and a plurality of conductive fillers where the substrate has a top surface, a bottom surface, and a plurality of bump holes penetrating from the top surface to the bottom surface and includes a circuit layer. A chip has an active surface and a plurality of bumps disposed on the active surface where the active surface is attached to the top surface of the substrate in a manner that the bumps are inserted into the bump holes respectively. The conductive fillers are formed in the bump holes to electrically connect the bumps of the chip to the circuit layer of the substrate.

DETAIL DESCRIPTION OF THE INVENTION

Please refer to the attached drawings, the present invention will be described by means of embodiment(s) below.

Figure 1:
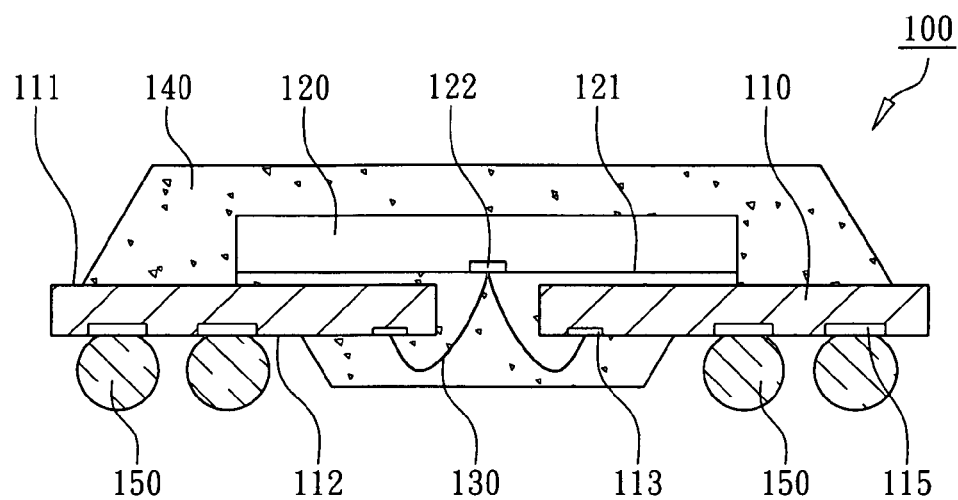
FIG. 1 is a cross-sectional view of a conventional wire-bonding type IC package.
Figure 2:
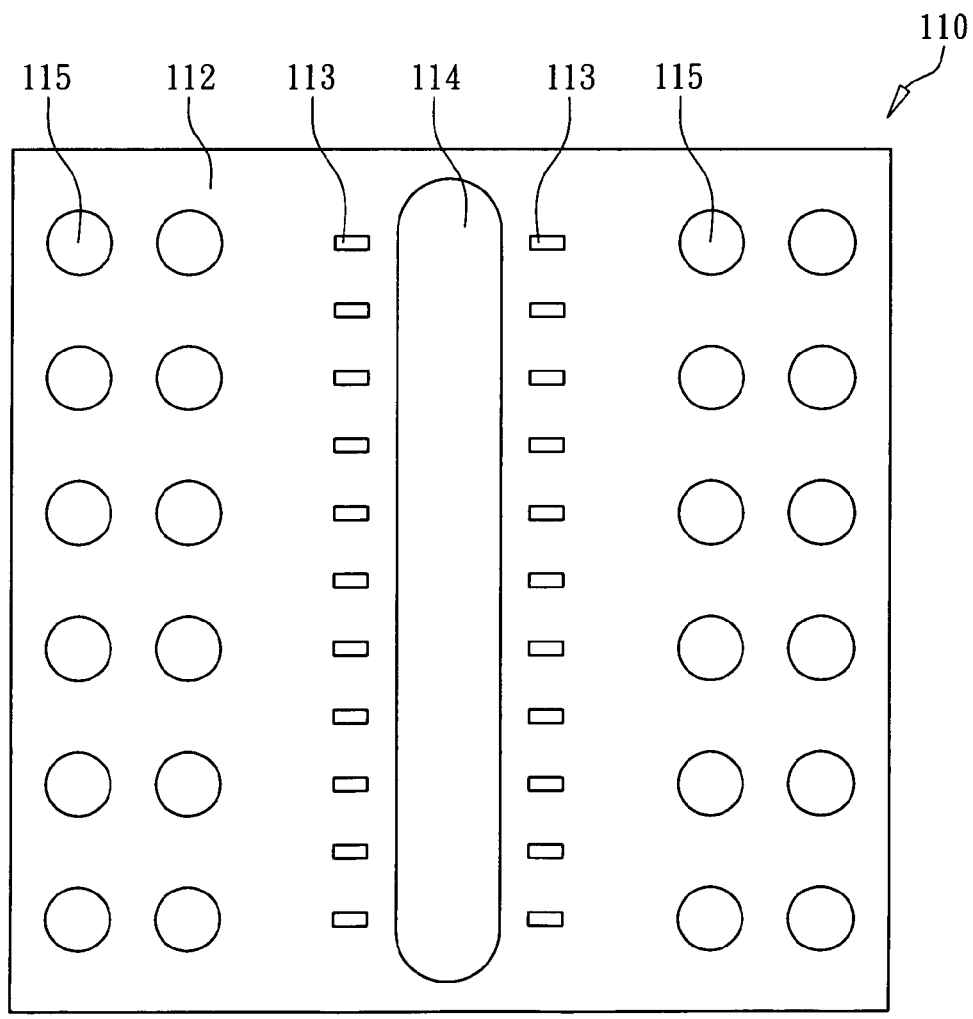
FIG. 2 is a bottom view of the substrate of a wire-bonding type IC package.
Figure 3:
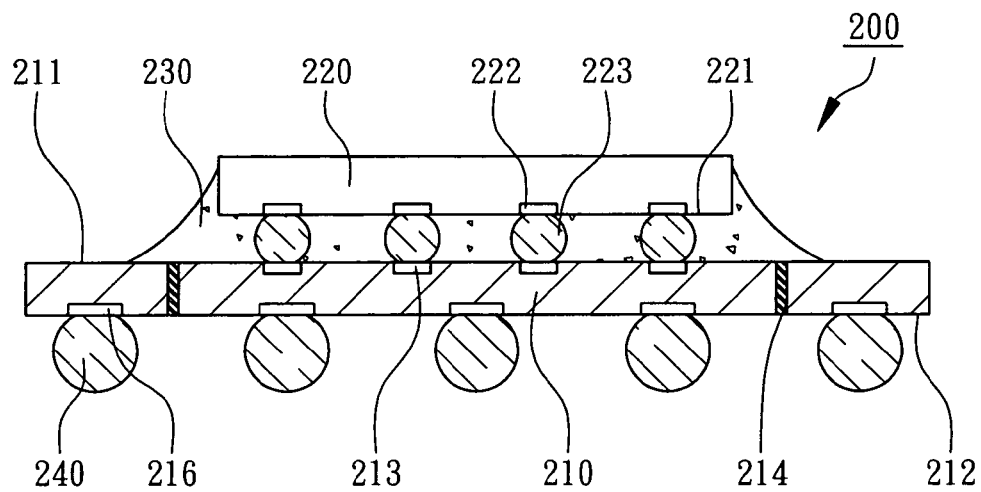
FIG. 3 is a cross-sectional view of another conventional flip-chip type IC package.
Figure 4:
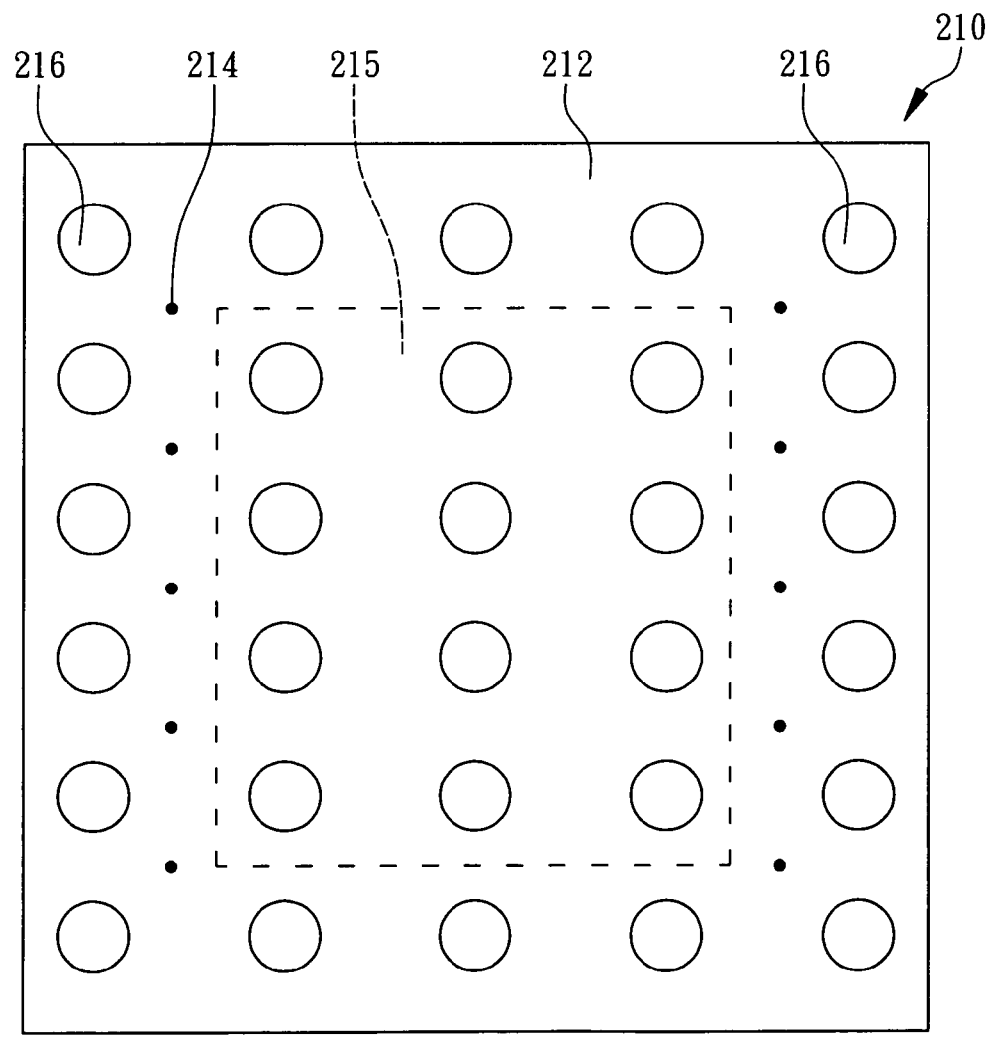
FIG. 4 is a bottom view of the substrate of a flip-chip type IC package.
Figure 5:
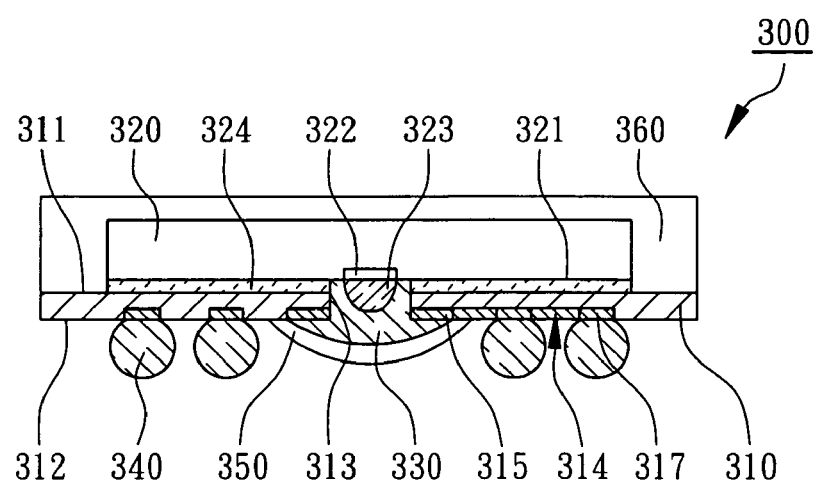
FIG. 5 is a cross-sectional view of a high frequency IC package according to the first embodiment of the present invention.
Figure 6:
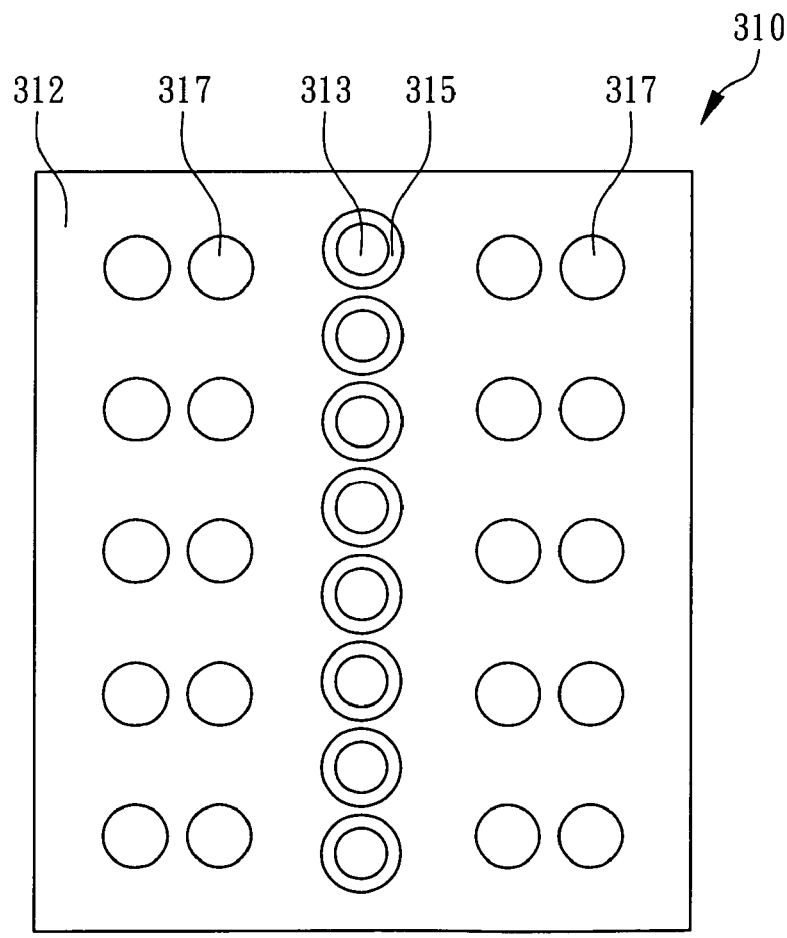
FIG. 6 is a bottom view of the substrate of the high frequency IC package according to the first embodiment of the present invention.
Figure 7:
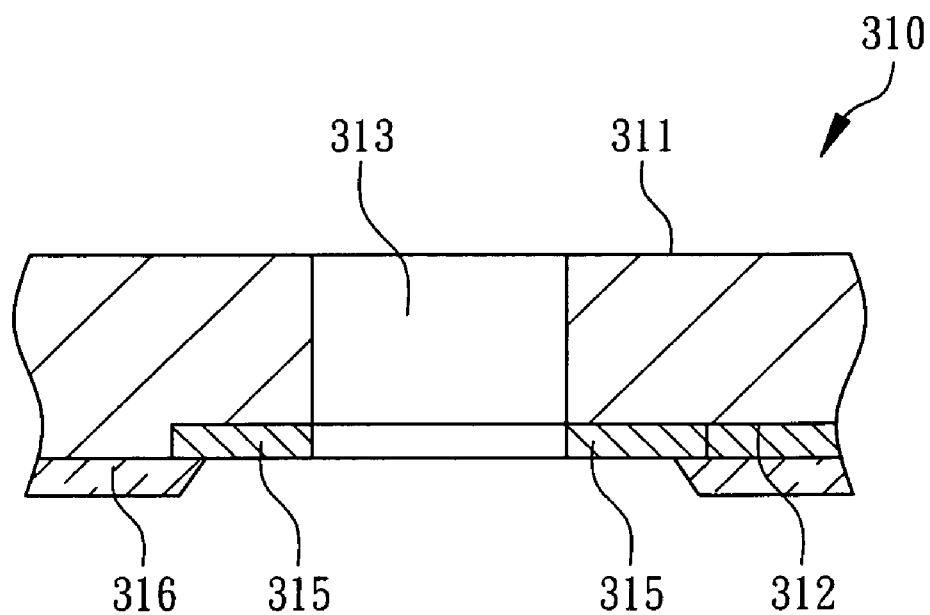
FIG. 7 is a partial cross-sectional view of the substrate of the high frequency IC package according to the first embodiment of the present invention.

In the first embodiment according to present invention, as shown in FIG. 5, a high frequency IC package 300 comprises a substrate 310, a chip 320 having a plurality of bumps 323, and a plurality of conductive fillers 330. The substrate 310 may be a single-layer flexible printed circuit (FPC) without plated through hole (PTH), such as COF, TCP, or PI wiring film. The substrate has a top surface 311, a bottom surface 312 and a plurality of bump holes 313 penetrating from the top surface 311 to the bottom surface 312. The substrate 310 includes a circuit layer 314. In the present embodiment, the bump holes 313 are cylindrical and each of them has a diameter larger than the corresponding bumps 323. The circuit layer 314 is formed on the bottom surface 312 and includes a plurality of connecting pads 315 located at one end of the bump holes 313. Preferably, as shown in FIG. 6, the connecting pads 315 are hollow and annular surrounding the bump holes 313 respectively for the electrical connection of the conductive fillers 330. As shown in FIG. 7, the substrate 310 further comprises a solder mask 316 formed on the bottom surface 312 to partially cover the circuit layer 314. In the present embodiment, the solder mask 316 even covers the periphery and the outer sidewalls of the connecting pads 315 so as to become SMD pads (Solder Mask Defined pads), it can increase the adhesion of the connecting pads 315 and prevent the overflow of the conductive fillers 330. Moreover, the circuit layer 314 of the substrate 310 further includes a plurality of ball pads 317 for placing a plurality of solder balls 340 to be a BGA package (Ball Grid Array package), for SMT connecting to a printed circuit board.

The chip 320 has an active surface 321 where a plurality of bonding pads 322 are formed on the active surface 321. In the present embodiment, the chip 320 is a high-frequency memory chip, especially a DDR II or DDR III DRAM with date rates greater than 333 MHz. Moreover, the chip 320 has a plurality of bumps 323 disposed on the bonding pads 322. The active surface 321 is attached to the top surface 311 of the substrate 310 by a die-attaching layer 324 in a manner that the bumps 323 are inserted into the bump holes 313 respectively. Accordingly, the spacing between the substrate 310 and the chip 320 can be reduced to assure the high frequency IC package 300 to be thinner. The die-attaching layer 324 is a printed B-stage resin layer by printing and pre-curing, non-conductive paste (NCP), or other commonly used die-attaching materials.

The conductive fillers 330 are formed in the bump holes 313 to establish electrical connections between the bumps 323 and the corresponding connecting pads 315 so that the chip 320 are electrically connected to the circuit layer 314 of the substrate 310. The bumps 323 are selected from pillar bumps by plating, spherical bumps, and stud bumps by wire bonding where the materials of the bumps 323 can be gold, solder, or alloy of copper-tin-silver etc. The conductive fillers 330 can be solder paste or conductive ink, formed in the openings of the bump holes 313 toward the bottom surface 312 of the substrate 310 by printing. Preferably, the conductive fillers 330 are also formed on the ball pads 317 to become the solder balls 340 after reflowing.

The high frequency IC package 300 further comprises a first encapsulant 350. In the present embodiment, the first encapsulant 350 is formed on the bottom surface 312 of the substrate 310 to encapsulate the conductive fillers 330 by molding or dispensing. Furthermore, the high frequency IC package 300 further comprises a second encapsulant 360 which is formed on the top surface 311 of the substrate 310 to encapsulate the sidewalls and the back surface of the chip 320 and the die-attaching layer 324 by molding. The chip 320 is electrically connected to the substrate 310 by the bumps 323 and the conductive fillers 330 to greatly shorten the path of electrical connection. Moreover, the bumps 323 are individually disposed in the bump holes 313 respectively so that the overall thickness can be reduced. Since the substrate 310 is a flexible single-layer printed circuit board, therefore, the substrate cost can also be reduced.

Figure 8:
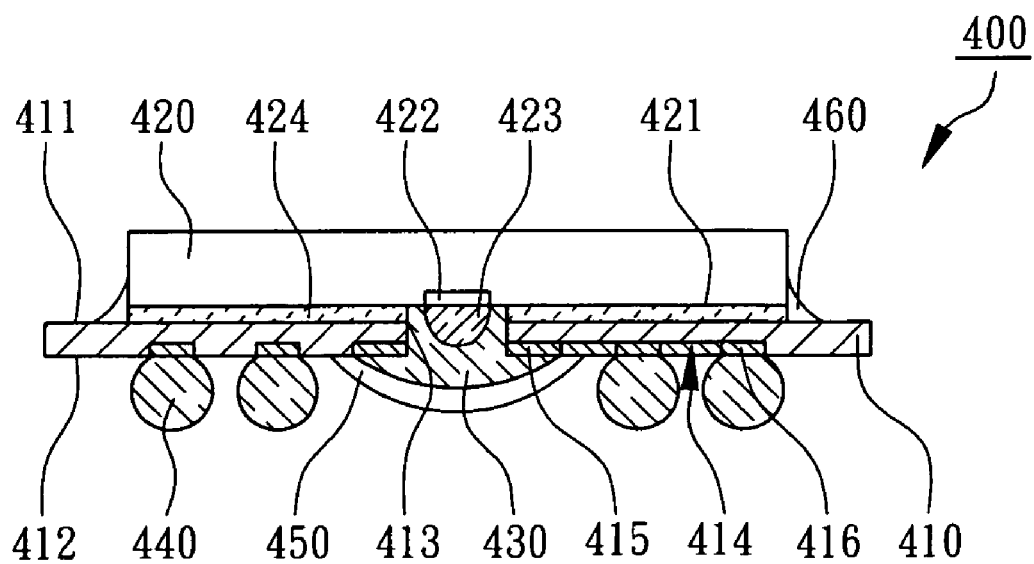
FIG. 8 is a cross-sectional view of a high frequency IC package according to the second embodiment of the present invention.

As shown in FIG. 8, the second embodiment of the present invention discloses a high frequency IC package 400 which comprises a substrate 410, a chip 420, and a plurality of conductive fillers 430 where the substrate 410 has a top surface 411, a bottom surface 412, and a plurality of bump holes 413 penetrating from the top surface 411 to the bottom surface 412. The substrate 410 includes a circuit layer 414 formed on the top surface 411 or the bottom surface 412. The circuit layer 414 includes a plurality of connecting pads 415 located at one end of the bump holes 413. Preferably, the circuit layer 414 of the substrate 410 further comprises a plurality of ball pads 416 which are electrically connected to the connecting pads 415 by the circuit layer 414 with equal trace lengths or within 15% of average trace length to eliminate the impacts of RC time delay due to different trace lengths to meet the requirement of high frequency packages.

The chip 420 is a DRAM, having an active surface 421 with a plurality of bumps 423 thereon. The active surface 421 is attached to the upper surface 411 of the substrate 410 in a manner that the bumps 423 on bonding pads 422 are inserted into the bump holes 413 respectively. Conductive fillers 430, such as solder paste or conductive ink, are formed in the bump holes 413 to electrically connect the bumps 423 to the circuit layer 414. In the present embodiment, a first encapsulant 450, such as underfill materials or others, is formed by dispensing on the bottom surface 412 of the substrate 410 to encapsulate the conductive fillers 430. A second encapsulant 460 is formed on the top surface 411 of the substrate 410 to encapsulate the exposed die-attaching layer 424 and the partial sidewalls of the chip 420. A plurality of solder balls 440 are disposed on the ball pads 416 for SMT connecting the package 400 to a printed circuit board. Since the bumps 423 are inserted into the corresponding bump holes 413 and the substrate 410 is a flexible single-layer printed circuit board, therefore, the overall package thickness can be reduced. Furthermore, the second encapsulant 460 is only dispensed around the sidewalls of the chip 420 to expose the back surface of the chip 420, therefore, the volume and weight of the encapsulant 460 can be reduced and the thermal dissipation can be enhanced.

Figure 9:
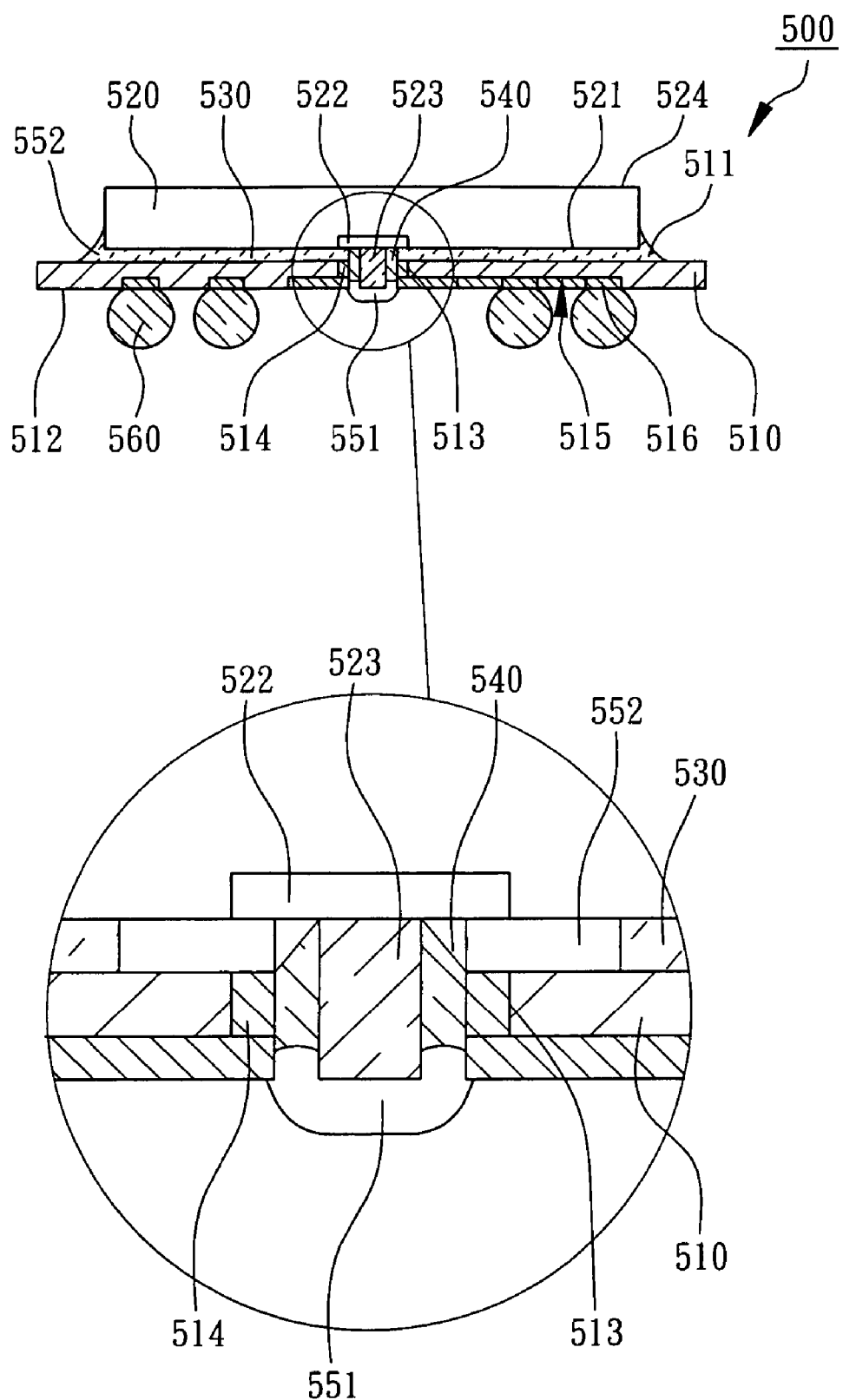
FIG. 9 is a cross-sectional view of a high frequency IC package according to the third embodiment of the present invention.
Figure 10:
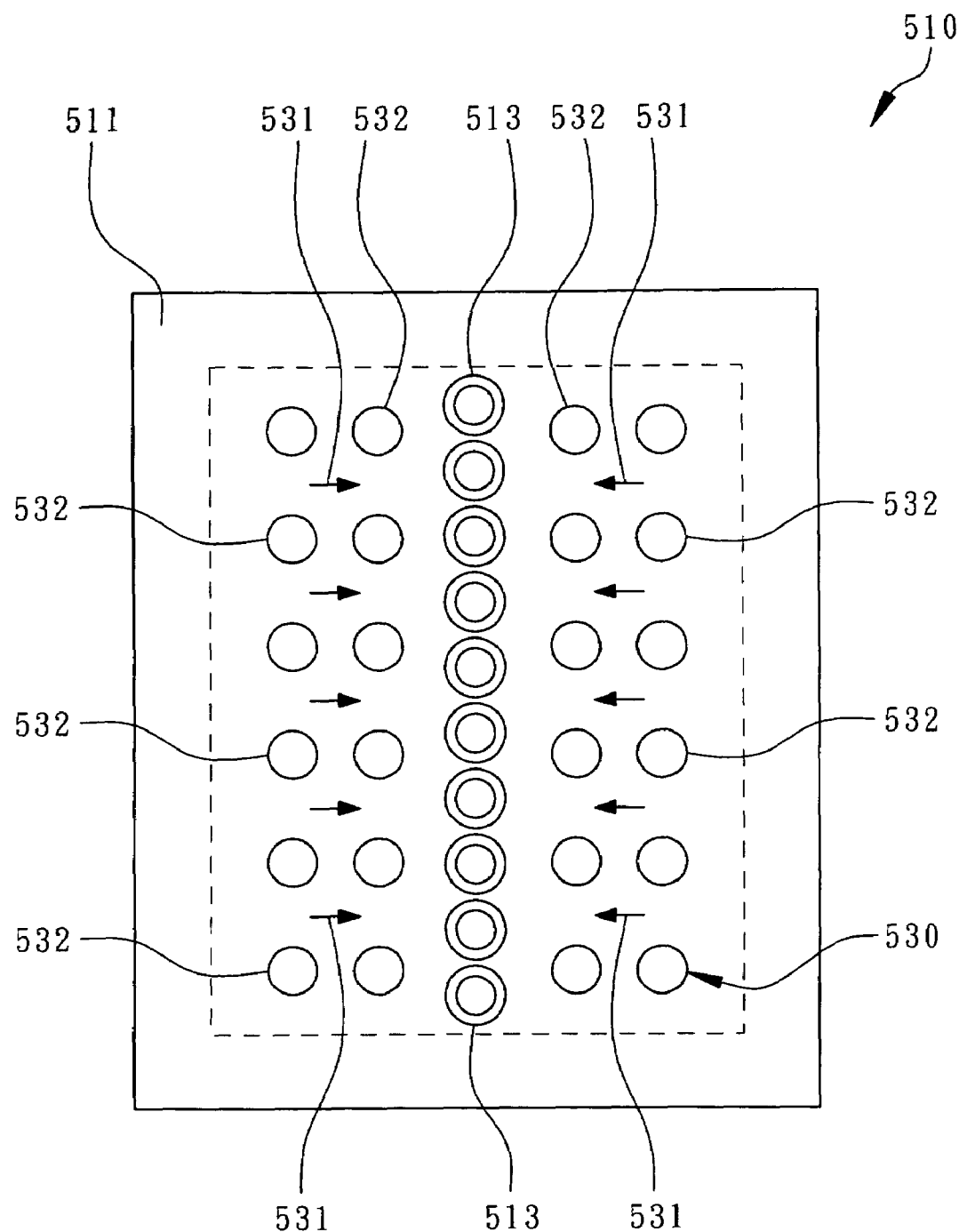
FIG. 10 is a top view of the substrate of the high frequency IC package showing a patterned die-attaching layer according to the third embodiment of the present invention.

The third embodiment of the present invention disclosed another high frequency IC package. As shown in FIG. 9, an IC package 500 comprises a substrate 510, a chip 520, a patterned die-attaching layer 530, and a plurality of conductive fillers 540. The substrate 510 has a top surface 511, a bottom surface 512, and a plurality of bump holes 513 penetrating from the top surface 511 to the bottom surface 512, and also includes a circuit layer 515. Therein a plated layer 514 is formed on the sidewalls of the bump holes 513 and are electrically connected to the circuit layer 515. The chip 520 has an active surface 521 with a plurality of bumps 523 disposed on the bonding pads 522 on the active surface 521 where the bumps 523 are disposed at the center or at the peripheries of the active surface 521. When the active surface 521 of the chip 520 is attached to the top surface 511 of the substrate 510 by the patterned die-attaching layer 530, the bumps 523 are inserted into the bump holes 513. In this embodiment, as shown in FIG. 10, the patterned die-attaching layer 530 consists of a plurality of adhesive resin bumps 532, which being cylindrical in shape is preferable for filling an underfill material 552. Accordingly, a plurality of encapsulant flowing channels 531 are formed between the adhesive resin bumps 532 of the die-attaching layer 530. Regarding to one of formations of the die-attaching layer 530, a liquid compound with multiple curing agents is formed on the active surface 521 of the substrate 520 or on the top surface 511 of the substrate 510 by stencil printing screen printing or potting at the beginning, and then the liquid compound is pre-cured in B-stage with a specific pattern. After die-attaching and fully curing, the patterned B-stage adhesive transforms into the die-attaching layer 530.

The conductive fillers 540 are formed in the bump holes 513 to electrically connect the bumps 523 to the plated layer 514. In this embodiment, the conductive fillers 540 are solder pastes, further formed on the plurality of ball pads 516 on the bottom surface 512 of the substrate 510. By reflowing, the conductive fillers 540 in the bump holes 513 electrically connect the chip 520 and the substrate 510, and the conductive fillers on the ball pads 516 are transformed into a plurality of solder balls 560. A first encapsulant 551 with good electrical insulation is formed on the bottom surface 512 of the substrate 510 to cover the bump holes 513 and the conductive fillers 540.

Therefore, in the present invention, the bumps 523 of the chip 520 are inserted into the bump holes 513 from the top surface 511 of the substrate 510 during die-attaching processes. Moreover, the conductive fillers 540 is formed in the openings of the bump holes 513 from the bottom surface 512 of the substrate 510. The bumps 523 are electrically connected to the circuit layer 515 through the conductive fillers 540 and the plated layer 514 inside the bump holes 513. Therefore, the substrates and the chip are economical without extra cost, also the overall package thickness of the high frequency IC package 500 is reduced with the shortest electrical path and is most suitable for the mass production of high frequency memory devices.

Moreover, the high frequency IC package 500 further comprises a second encapsulant 552 formed between the chip 520 and the substrate 510 and filling the encapsulant flowing channels 531 of the patterned die-attaching layer 530 to encapsulate the patterned die-attaching layer 530 so as to enhance die-attaching strength of the chip 520 and mechanically connect the chip 520 and the substrate 510. In the present embodiment, the second encapsulant 552 is an underfill material. Therefore, the second encapsulant 552 can completely fill the gaps between the chip 520 and the substrate 510 to avoid bubbles. Furthermore, the patterned die-attaching layer 530 can absorb the thermal stress of the chip 520, especially, when the substrate 510 is a flexible printed circuit board.

The above description of embodiments of this invention is intended to be illustrative and not limiting. Other embodiments of this invention will be obvious to those skilled in the art in view of the above disclosure.

What is claimed is:

1. An IC package comprising:
    a substrate having a top surface, a bottom surface, and a plurality of bump holes penetrating from the top surface to the bottom surface, and the substrate including a circuit layer;
    a chip having an active surface and a plurality of bumps disposed on the active surface, wherein the active surface is attached to the top surface of the substrate in a manner that the bumps are inserted into the bump holes respectively; and
    a plurality of conductive fillers formed inside the bump holes to electrically connect the bumps with the circuit layer,
    wherein the circuit layer is formed on the bottom surface of the substrate and includes a plurality of connecting pads located at one ends of the bump holes,
    wherein the connecting pads are hollow and annularly surround the corresponding bump holes.

2. The IC package of claim 1, wherein the substrate further includes a solder mask on the bottom surface to partially cover the circuit layer.

3. The IC package of claim 2, wherein the solder mask partially covers the periphery of the connecting pads to be SMD (solder mask defined).

4. The IC package of claim 1, wherein the circuit layer further includes a plurality of ball pads in an array, wherein the trace lengths of the circuit layer connecting the connecting pads to the ball pads are equal or within 15% of a mean average trace length.

5. The IC package of claim 1, wherein the substrate is a single-layer flexible printed circuit (FPC) without plated through hole (PTH).

6. The IC package of claim 1, wherein the conductive fillers are solder paste or conductive ink.

7. The IC package of claim 1, wherein the conductive fillers are further formed on the plurality of ball pads of the circuit layer.

8. The IC package of claim 1, further comprising a die-attaching layer between the active surface and the top surface.

9. The IC package of claim 8, wherein the die-attaching layer is patterned to form a plurality of adhesive resin bumps.

10. The IC package of claim 9, further comprising an encapsulant filling a plurality of encapsulant flowing channels formed between the adhesive resin bumps.

11. The IC package of claim 1, further comprising an encapsulant formed on the bottom surface to encapsulate the conductive fillers.

12. The IC package of claim 1, wherein of the connecting pads are aligned with the bump holes, the openings of the connecting pads are equal to or larger than the bump holes, the conductive fillers jut out from the bump holes and the openings to cover the connecting pads, wherein surfaces of the connecting pads exposed from the bottom surface are covered with the conductive fillers.

* * * * *